US009070858B2

(12) United States Patent
Pirovano

(10) Patent No.: US 9,070,858 B2
(45) Date of Patent: Jun. 30, 2015

(54) METHOD, SYSTEM, AND DEVICE FOR STORAGE CELL, SUCH AS FOR MEMORY

(75) Inventor: Agostino Pirovano, Milan (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 754 days.

(21) Appl. No.: 13/422,100

(22) Filed: Mar. 16, 2012

(65) Prior Publication Data

US 2013/0242649 A1    Sep. 19, 2013

(51) Int. Cl.
*G11C 11/00*  (2006.01)
*H01L 45/00*  (2006.01)
*H01L 27/24*  (2006.01)

(52) U.S. Cl.
CPC .............. *H01L 45/06* (2013.01); *H01L 45/126* (2013.01); *H01L 45/1683* (2013.01); *H01L 27/2436* (2013.01)

(58) Field of Classification Search
USPC .................................. 365/164, 174, 179, 163
See application file for complete search history.

(56) References Cited

U.S. PATENT DOCUMENTS

| 7,593,254 | B2 | 9/2009 | Liu |
| 7,633,079 | B2 | 12/2009 | Chen et al. |
| 8,043,888 | B2 | 10/2011 | Mathew et al. |
| 8,541,767 | B2 * | 9/2013 | Fang et al. .......... 257/4 |
| 2010/0108977 | A1 | 5/2010 | Yoon et al. |
| 2011/0057161 | A1 | 3/2011 | Sandhu et al. |
| 2011/0073829 | A1 | 3/2011 | Park et al. |
| 2011/0248233 | A1 | 10/2011 | Pellizzer et al. |

* cited by examiner

*Primary Examiner* — Fernando Hidalgo
(74) *Attorney, Agent, or Firm* — Knobbe Martens Olson & Bear LLP

(57) ABSTRACT

Embodiments disclosed herein may relate to forming an interface between a selector transistor and a phase change material storage cell in a memory device.

23 Claims, 11 Drawing Sheets

FIG. 1 – Prior Art

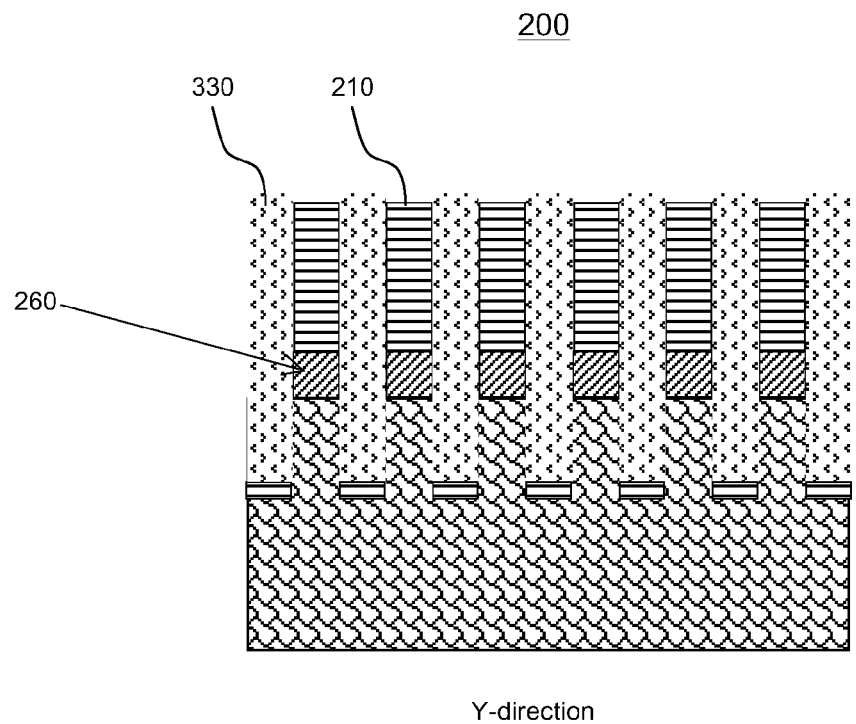
Y-direction
FIG. 3
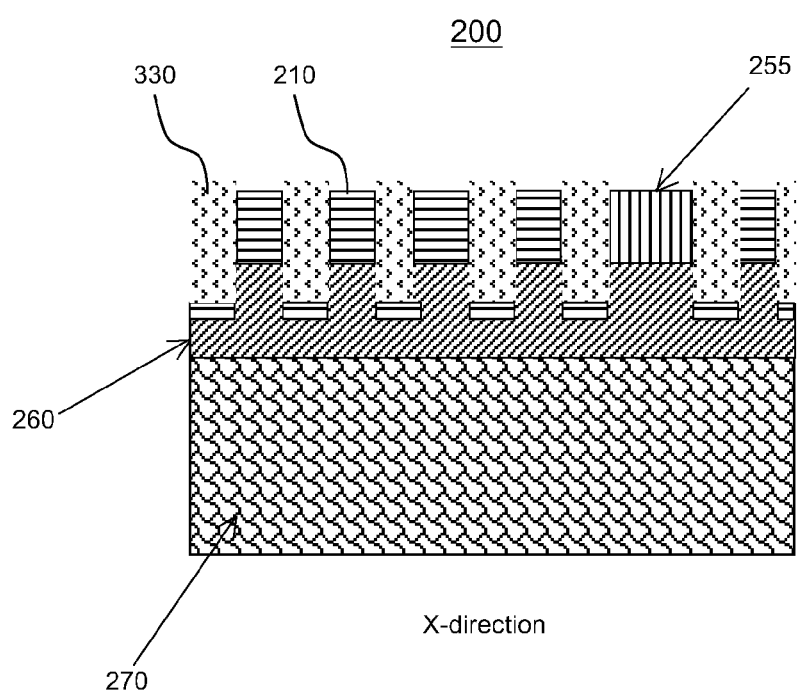
X-direction

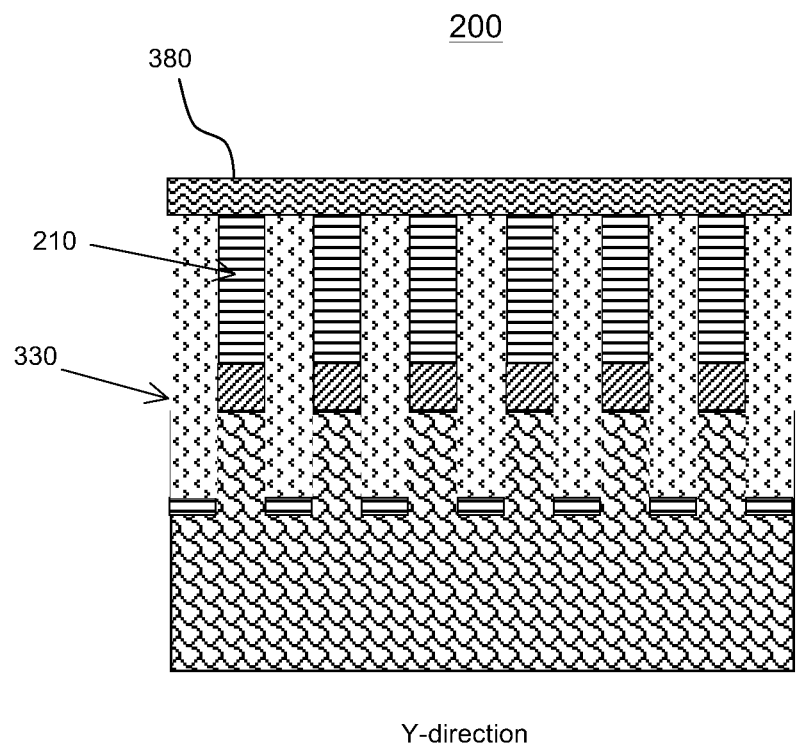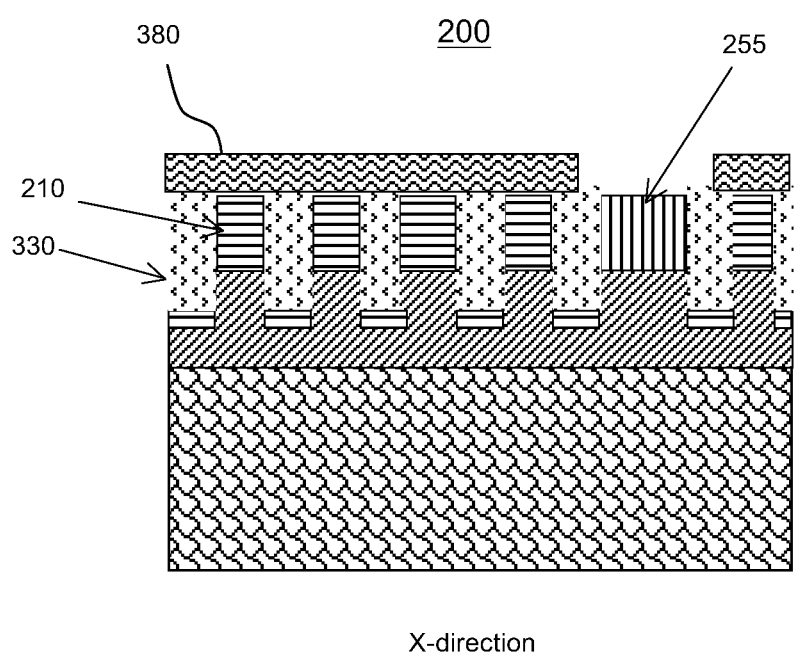
FIG. 4

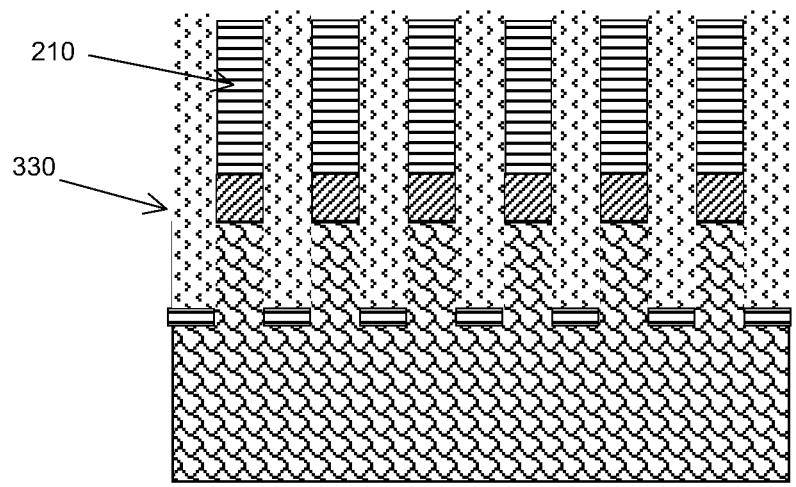
Y-direction
FIG. 5
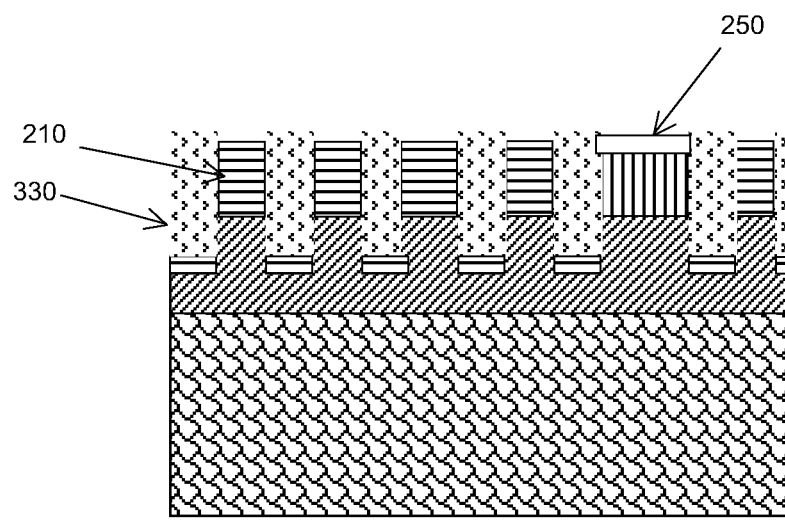
X-direction

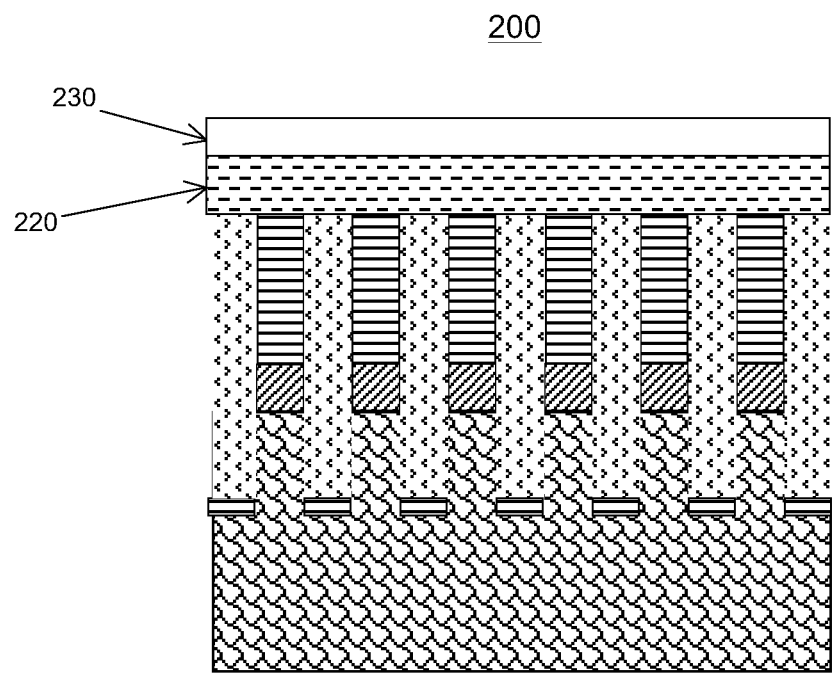
Y-direction
FIG. 6
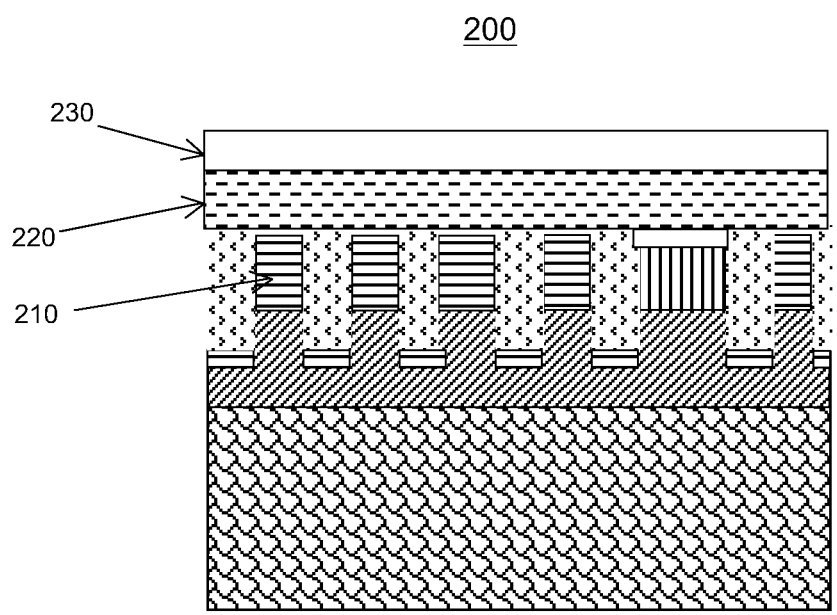
X-direction

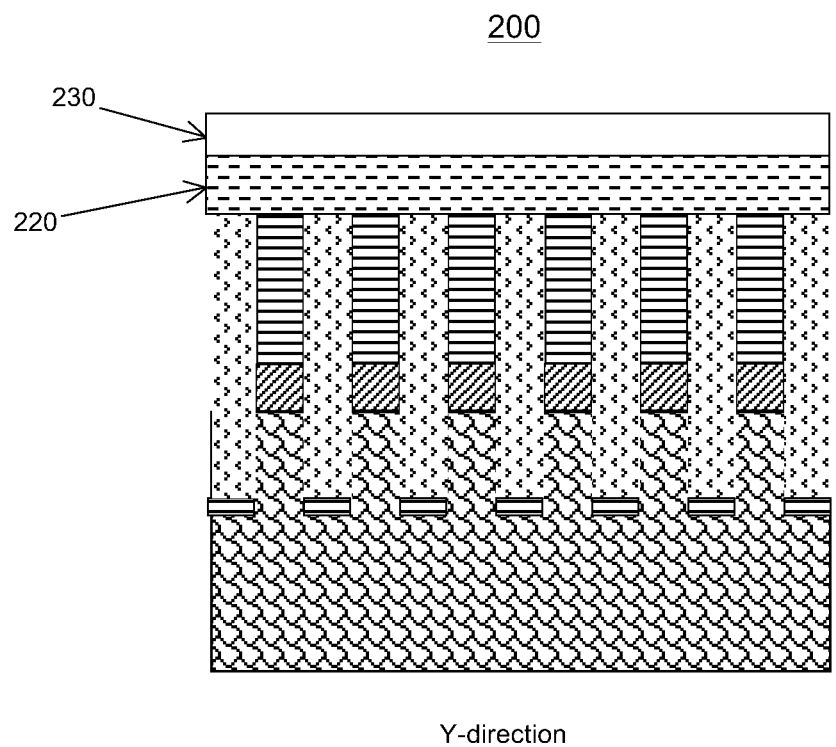
Y-direction
FIG. 7
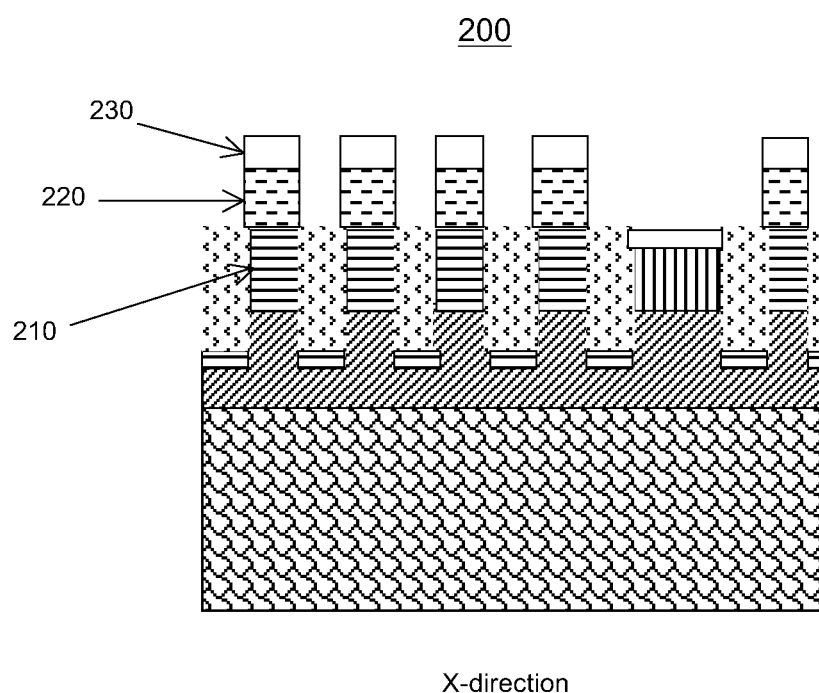
X-direction

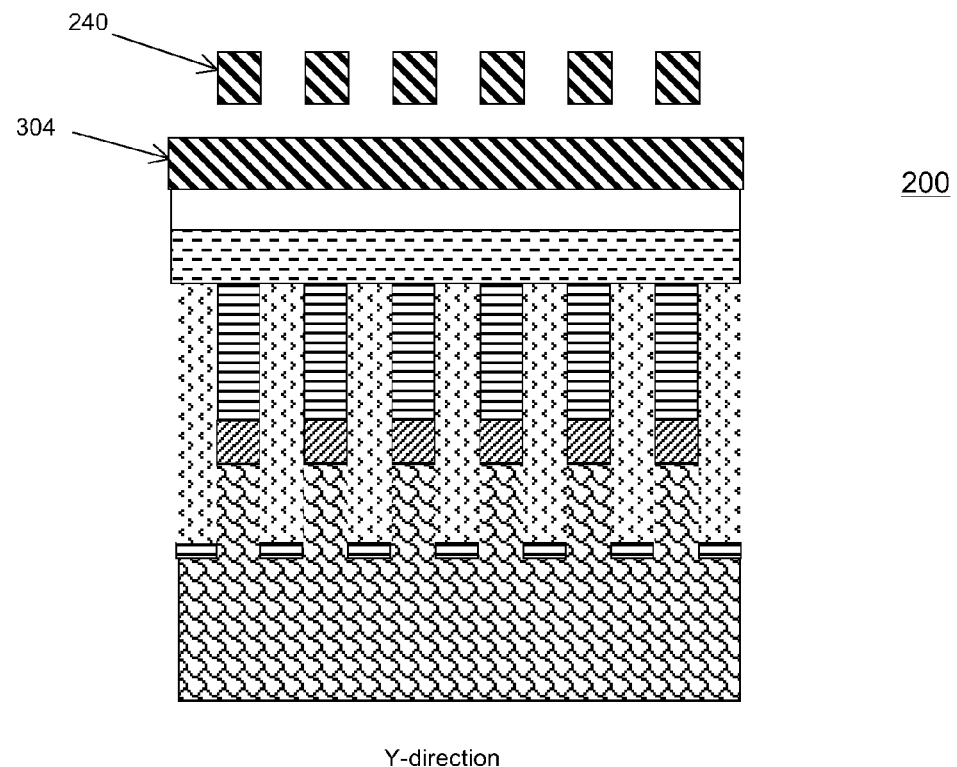
Y-direction
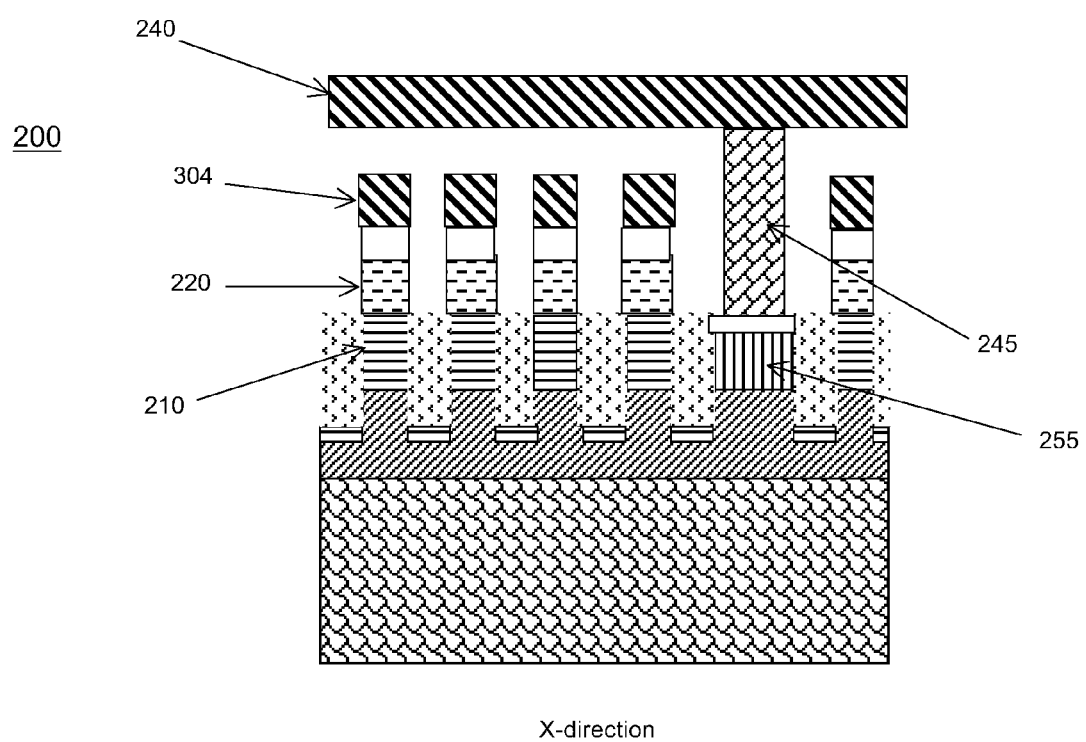
X-direction
FIG. 8

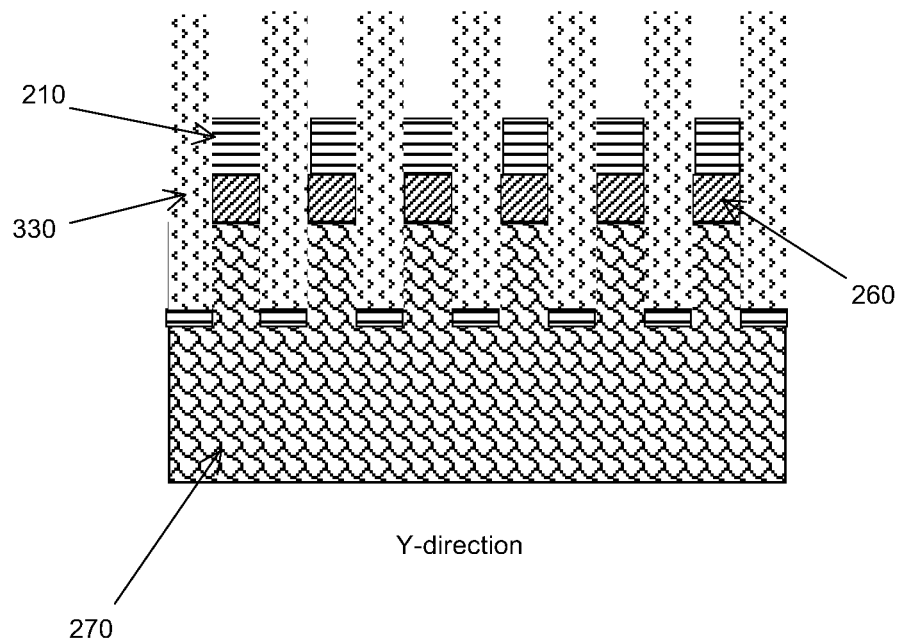
FIG. 9
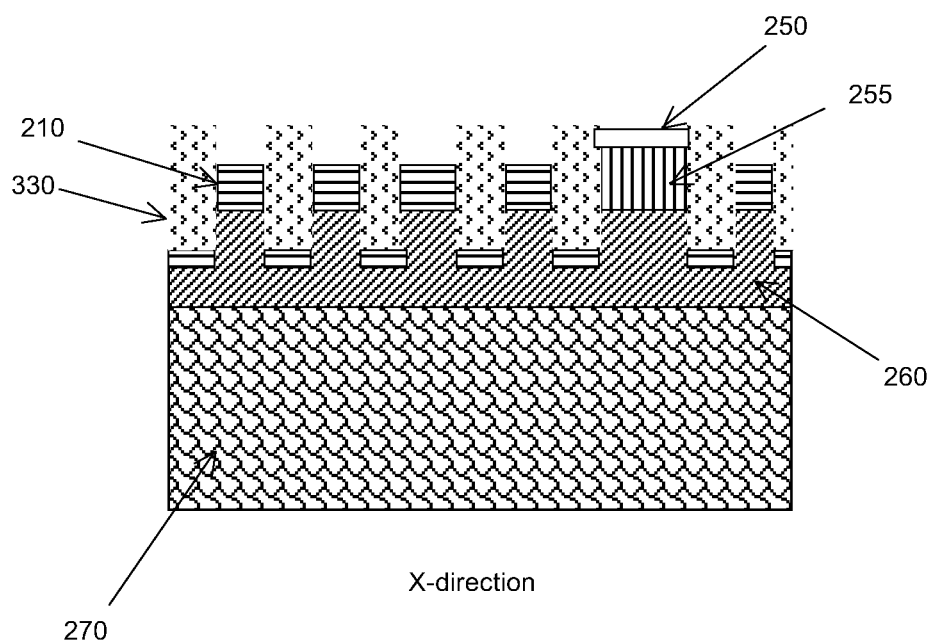

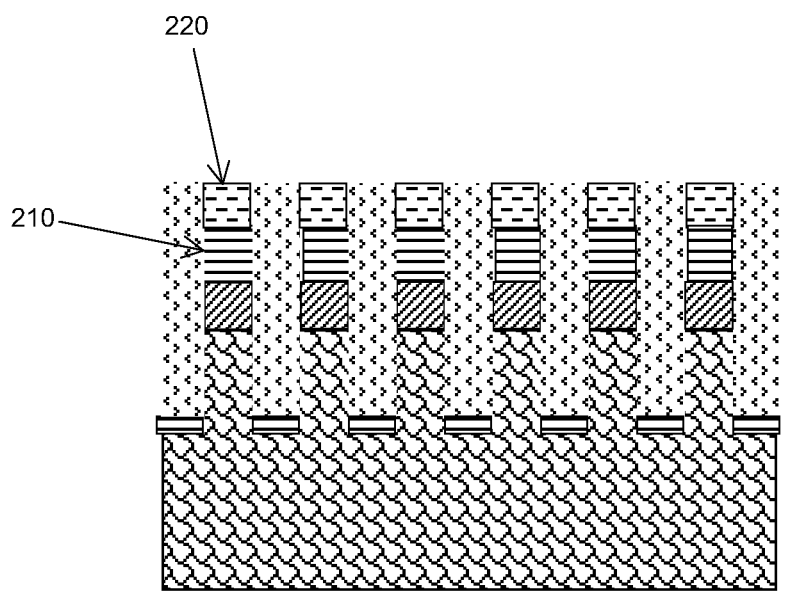
Y-direction
FIG. 10
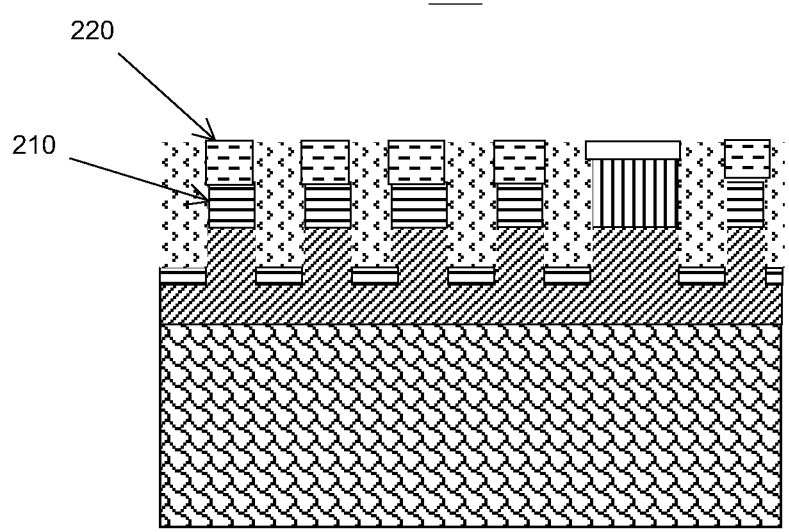
X-direction 200
230
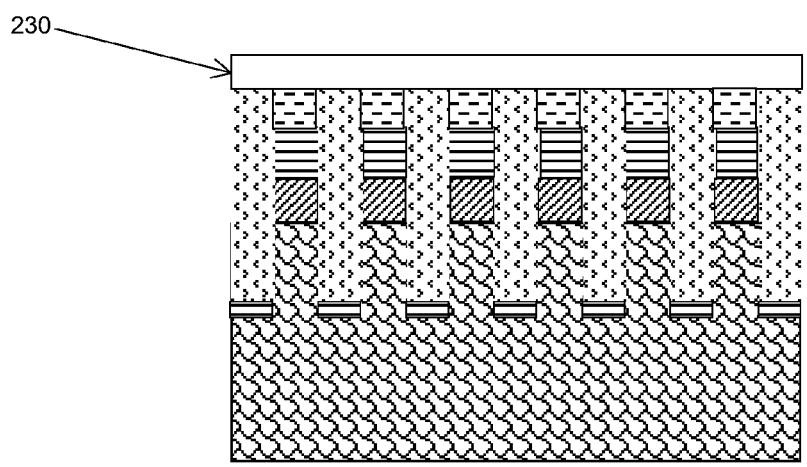
Y-direction
FIG. 11
200
230
312
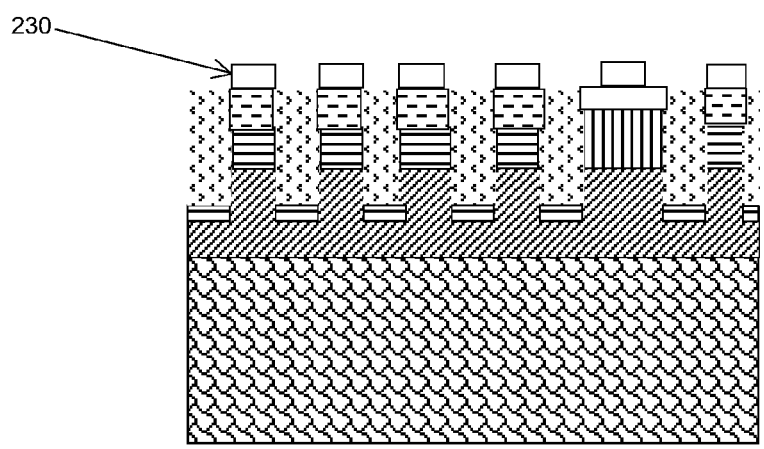
X-direction

METHOD, SYSTEM, AND DEVICE FOR STORAGE CELL, SUCH AS FOR MEMORY

BACKGROUND

1. Field

Subject matter disclosed herein may relate to integrated circuit devices, and may relate, more particularly, to memory-related circuitry.

2. Information

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for any particular application may include, physical size, storage density, operating voltages, granularity of read/write operations, throughput, transmission rate, and/or power consumption, for example. Other example factors that may be of interest to system designers may include cost of manufacture and/or ease of manufacture.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 3 is an illustration depicting a cross-sectional view of a process stage associated with forming a memory device, such as a PCM device, according to an embodiment.

FIG. 4 is an illustration depicting a cross-sectional view of process stage associated with forming a memory device, such as a PCM device, according to an embodiment.

FIG. 5 is an illustration depicting a cross-sectional view of process stage associated with forming a memory device, such as a PCM device, according to an embodiment.

FIG. 6 is an illustration depicting a cross-sectional view of process stage associated with forming a memory device, such as a PCM device, according to an embodiment.

FIG. 7 is an illustration depicting a cross-sectional view of a process stage associated with forming a memory device, such as a PCM device, according to an embodiment.

FIG. 8 is an illustration depicting a cross-sectional view of process stage associated with forming a memory device, such as a PCM device, according to an embodiment.

FIG. 9 is an illustration depicting a cross-sectional view of process stage associated with forming a memory device, such as a PCM device, according to an embodiment.

FIG. 10 is an illustration depicting a cross-sectional view of process stage associated with forming a memory device, such as a PCM device, according to an embodiment.

FIG. 11 is an illustration depicting a cross-sectional view of process stage associated with forming a memory device, such as a PCM device, according to an embodiment.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit the scope of claimed subject matter and/or equivalents.

DETAILED DESCRIPTION

Figure 1:
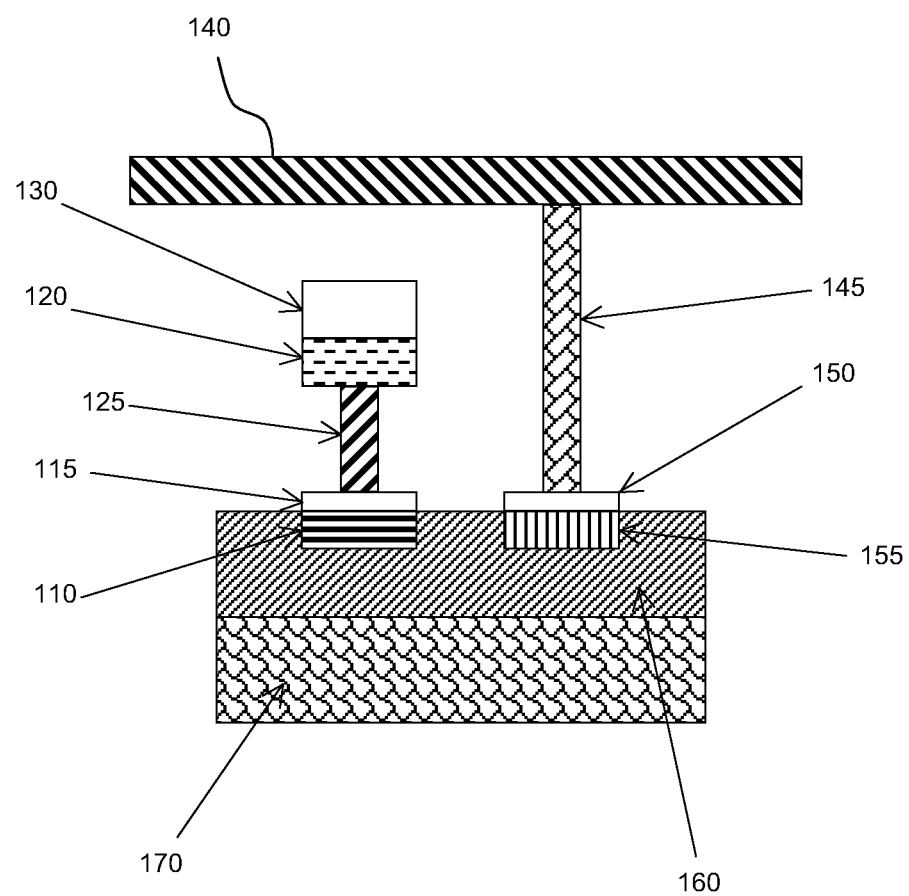
FIG. 1 is an illustration depicting a cross-sectional view of a conventional memory device, such as a conventional PCM device.

FIG. 1 is an illustration depicting a cross-sectional view of an embodiment 100 of a conventional memory device comprising a phase change memory (PCM) device formed over a surface of a substrate (not shown). In an embodiment, a memory device, such as device 100, may employ one or more transistors, such as one or more bipolar junction transistors, for example, as selectors for individual memory cells. For example, a memory device, such as 100, may comprise one or more transistors including one or more collector components, such as collector 170, one or more base components, such as base 160, and one or more emitter components, such as one or more emitters 110. In an embodiment, an emitter, base, and collector combination may form one or more bipolar junction transistors, for example.

In an embodiment, a base component, such as base 160, a collector component, such as collector 170, and one or more emitter components, such as one or more emitters 110, may comprise a respective one or more transistors that may be implemented as selectors for a respective one or more memory materials, such as one or more phase change memory materials 120, referred to as "phase change memory (PCM) material in the following. In an embodiment, a memory material, such as phase change memory material 120, may be selected, such as by use of sufficient and/or appropriate signals, such as voltage signals, with a first electrode, such as word line 140, and/or with a second electrode, such as bit line 130.

An electrically conductive component, such as an "electrode," refers to component that may be utilized to route signals and/or supply power within a memory array. An electrically conductive component, such as an electrode, may comprise a sufficiently electrically conductive material, such as polysilicon, carbon, and/or metallic material, such as tungsten, titanium nitride, and/or titanium aluminum nitride, for example, for use in a memory device. Example electrically conductive components may include, for example, base interconnects 145, base contacts 155, word line 140, and/or bit lines 130. Of course, claimed subject matter is not limited in scope in these respects. Other materials may, of course, also be used in an embodiment.

In an embodiment, a voltage signal may be used in conjunction with an electrode, such as word-line 140, and may be used in conjunction with a base component, such as base 160, via one or more electrically conductive components, such as an interconnect and/or a contact, for example, base interconnect 145 and/or base contact 155. Also, in an embodiment, a voltage signal for a base component, such as base 160, may be employed with one or more emitters, such as one or more emitters 110, and a collector component, such as collector 170. In an embodiment, a particular storage component, such as a particular phase change memory material 120, may be accessed at least in part by use of appropriate voltage signal levels for a first electrode, such as word line 140, and/or for a second electrode, such as a particular bit line 130, for example. For example, a voltage signal may be employed to energize one or more bipolar transistors, for example. In an embodiment, an electrically conductive component, such as an interconnect, for example, base interconnect 145, may comprise tungsten, although claimed subject matter is not limited in this respect.

For a memory device, such as 100, a storage material, such as phase change memory (PCM) material 120, may comprise a chalcogenide glass material, in an embodiment. PCM material 120, for example, may have a configuration to retain or store a memory state comprising one of at least two different selectable states. In a binary system, states may comprise a binary "0" value or a binary "1" value, where a "set" state, representing a binary value of '1', for example, may correspond to a more crystalline, more conductive state for a PCM material and a "reset" state, representing a binary value of '0', for example, may correspond to a more amorphous, more resistive state. In other systems, at least some individual memory materials may have a configuration to store more than two levels or states. In a PCM array, heat sufficient to change a phase of a memory material may be achieved by use of a current and/or voltage pulse, in an embodiment. In an embodiment, a PCM device, such as PCM device 100, may comprise one or more heater components 125 that may be utilized to provide heat sufficient to melt at least a portion of PCM material 120. Further, in one or more example embodiments, memory devices may comprise one or more technologies other than PCM, such as resistive memory technologies and/or other types of memory, and claimed subject matter is not limited in scope in this respect.

In an embodiment, a silicide region 115 may provide a low-resistance interface between emitter 110 and heater component 125, for example. A silicide region, such as silicide region 150 may also by utilized to provide a low-resistance interface between a base contact, such as base contact 155, and a base interconnect, such as base interconnect 145, in an embodiment.

In conventional PCM device, such as PCM device 100, storage cell architecture may comprise a selector transistor, decoding circuitry, and a PCM storage material, such as PCM material 120. A conventional PCM device, such as PCM device 100, may also comprise a heater component, such as heater component 125, as described above. Incorporating a heater component, such as heater component 125, may introduce a relatively large amount of complexity to a fabrication process due at least in part to relatively small contact areas between heater components and PCM storage material that may be desirable to reduce storage cell programming current. Additionally, incorporation of a heater component, such as heater component 125, for example, may have a negative effect on overall reliability for a PCM memory device. Example conditions that may negatively affect reliability may include, for example, relatively high programming current density that may flow through a heater component that may pose a risk of electro-migration consequences. Additionally, incorporation of a heater component, such as heater component 125, in a conventional PCM device may increase an amount of processing operations during fabrication, and may also increase manufacturing costs, for example.

Figure 2:
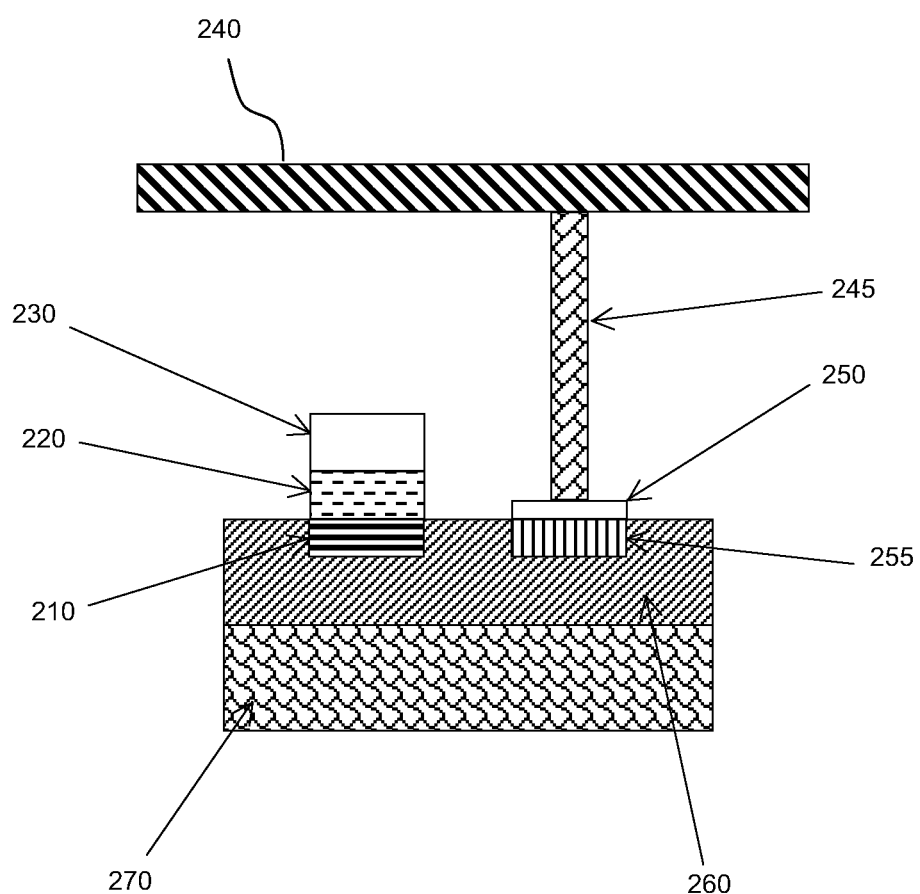
FIG. 2 is an illustration depicting a cross-sectional view of a memory device, such as a PCM device, according to an embodiment.

FIG. 2 is an illustration depicting a cross-sectional view of a memory device, such as a PCM device, according to an embodiment. In an embodiment, a memory device, such as device 200, may comprise one or more transistors including one or more collector components, such as collector 270, one or more base components, such as base 260, and one or more emitter components, such as one or more emitters 210. In an embodiment, an emitter, base, and collector combination may form one or more bipolar junction transistors, for example. Also, in an embodiment, a memory material, such as PCM material 220, may be selected, such as by use of sufficient and/or appropriate signals, such as voltage signals, with a first electrode, such as word line 240, and/or with a second electrode, such as bit line 230. PCM device 200 may further comprise additional electrically conductive components, such as a base interconnect 245 and a base contact 255, for example. Although example embodiments described herein may comprise bipolar junction transistors, other embodiments may be implemented utilizing other types of selectors, such as complementary metal oxide semiconductor (CMOS) transistors. For example, a CMOS drain may correspond to a BJT emitter, a CMOS gate may correspond to BJT base, and a CMOS source may correspond to a BJT collector, in one or more embodiments, although claimed subject matter is not limited in these respects.

In an embodiment, a fabrication process may be simplified and/or production costs may be reduced by implementing a PCM device, such as PCM device 200, without heater components for storage cells of a PCM array, for example. In an embodiment, a PCM material, such as PCM material 220, may itself be heated to appropriate temperatures for programming operations at least in part through application of sufficient programming current. Also, in an embodiment, rather than forming a silicide region, such as silicide region 115, between an emitter, such as emitter 110, and a heater component, such as heater component 125, for example, an emitter/PCM material contact area may be formed without forming a silicide region between an emitter and a PCM material. By not including a low-resistance silicide region between emitter 210 and PCM material 220, a higher-resistance connection may result, and greater temperatures may be achieved for programming without having to resort to increased programming currents.

Example advantages that may be realized by fabricating a PCM device without heater components may include a simplified fabrication. A fabrication process may be simplified, for example, by a reduction in an amount of lithographic masks and/or utilization of self-aligned techniques whereby existing structures may be utilized as masks during integrated circuit fabrication. Example advantages that may be realized by fabricating a PCM device without heater components may also include a reduction in programming current made possible by exploiting a higher resistance interface between an emitter, such as emitter 210, and a PCM material, such as PCM material 220, in an embodiment. In general, an interface between silicon of a selector transistor and a PCM storage material may act as a heater component, in an embodiment. Also, in an embodiment, avoiding creation of a silicide region between a selector transistor and a PCM material may be beneficial to forming a relatively high-resistance interface between a selector transistor and a PCM material. In an embodiment, a PCM material may be placed in substantially direct contact with silicon of a selector transistor. For example, PCM material 220 may be placed in substantially direct contact with emitter 210, in an embodiment.

In FIGS. 3-11, discussed below, cross-sectional views of an illustration of a portion of an example PCM memory array are depicted showing various stages of an example fabrication process, in accordance with an embodiment. Of course, claimed subject matter is not limited in scope to the particular examples described herein. In FIGS. 3-11, cross-sectional views looking in two directions, an "X" direction and a "Y" direction, are provided. In an embodiment, an "X" direction may be substantially orthogonal to a "Y" direction. Not shown in FIGS. 3-11 is circuitry that may be formed around a periphery of a storage array, for example. Rather, FIGS. 3-11 are meant to illustrate example aspects related to PCM storage array fabrication, in accordance with one or more embodiments.

FIG. 3 is an illustration depicting cross-sectional views of a portion of an example PCM memory array showing a stage of an example fabrication process, in accordance with an embodiment. At a stage of an example fabrication process of a heater-less PCM array depicted in FIG. 3, transistor fabrication may be nearly complete. For example, doping and/or oxide growth may have formed collector region 270, base region 260, and/or emitters 210. An oxide region 330 may also have been formed at this stage of an example fabrication process. Additionally, a base contact region 255 may have been formed at this stage of an example fabrication process.

FIG. 4 is an illustration depicting cross-sectional views of a portion of an example PCM memory array showing a stage of an example fabrication process, in accordance with an embodiment. As illustrated in FIG. 4, a dielectric material 380 may be formed over at least a portion of PCM device 200. In an embodiment, dielectric layer may serve as a silicon protection layer, for example. Dielectric material 380 may be formed over emitters 210, and over oxide 330, in an embodiment. Additionally, as depicted in FIG. 4, dielectric layer 380 may be removed from base contact region 255, in an embodiment. To remove dielectric layer 380 from base contact region 255, lithographic techniques may be utilized, for example.

FIG. 5 is an illustration depicting cross-sectional views of a portion of an example PCM memory array showing a stage of an example fabrication process, in accordance with an embodiment. As illustrated in FIG. 5, a silicide material 250 may be formed over base contact region 255. In an embodiment, silicide material 250 may comprise cobalt, although claimed subject matter is not limited in this respect. Additionally, although FIG. 5 depicts silicide material 250, other embodiments may be implemented without silicide material 250. In an embodiment, silicide material 250 may reduce base contact resistance and may allow for a reduced programming voltage. Dielectric layer 380 may prevent silicide material 250 from being formed on emitters 210, in an embodiment. Dielectric layer 380 may be removed following formation of silicide material 250, in an embodiment.

FIG. 6 is an illustration depicting cross-sectional views of a portion of an example PCM memory array showing a stage of an example fabrication process, in accordance with an embodiment. As illustrated in FIG. 6, a phase change material 220 may be formed over array 200. Phase change material 220 may comprise chalcogenide glass material, in an embodiment. Additionally, in an embodiment, an electrode material 230 may be formed over phase change material 220. Phase change material 220 may be placed in substantially direct contact with silicon of a selector transistor. For example, phase change material 220 may be placed in substantially direct contact with emitter 210, in an embodiment.

FIG. 7 is an illustration depicting cross-sectional views of a portion of an example PCM memory array showing a stage of an example fabrication process, in accordance with an embodiment. As depicted in FIG. 7, phase change material 220 and electrode material 230 may be patterned along a direction, in an embodiment. For example, phase change material 220 and electrode material 230 may be patterned in a bit-line direction.

FIG. 8 is an illustration depicting cross-sectional views of a portion of an example PCM memory array showing a stage of an example fabrication process, in accordance with an embodiment. As depicted in FIG. 8, word-line electrodes 240 and/or bit-line electrodes 304 may be formed. Additionally, a base interconnect 245 may be formed to electrically connect word-line electrode 240 to base contact 255. In an embodiment, conventional back-end-of-line (BEOL) techniques may be utilized to form word-line electrodes 240 and/or bit-line electrodes 304, although claimed subject matter is not limited in scope in this respect.

In FIGS. 9-11, discussed below, additional cross-sectional views of an illustration of a portion of an example PCM memory array are depicted showing various stages of an additional example fabrication process, in accordance with an embodiment. Of course, claimed subject matter is not limited in scope to the particular examples described herein.

FIG. 9 is an illustration depicting cross-sectional views of a portion of an example PCM memory array showing a stage of an example fabrication process, in accordance with an embodiment. FIG. 9 depicts a stage following formation of a silicide region 250 and after removal of a dielectric protection layer, similar to FIGS. 4 and 5 discussed above. As depicted in FIG. 9, emitter material 210 pillars may be reduced in height by way of a selective etch-back process, in an embodiment.

FIG. 10 is an illustration depicting cross-sectional views of a portion of an example PCM memory array showing a stage of an example fabrication process, in accordance with an embodiment. As depicted in FIG. 10, recessed emitter regions may be filled with phase change material 220. In this manner, recessed emitter regions, that is, regions in oxide 330 vacated by etched-back emitters 210, may be utilized to form PCM material, providing a self-aligned technique for PCM storage cell fabrication. Of course, claimed subject matter is not limited in scope in this respect.

In an embodiment, phase change material 220 may be formed according to a conformal deposition technique, for example. In an embodiment, it may be beneficial to deposit phase change material 220 in a relatively highly conformal manner. Additionally, in an embodiment, array 200 may be planarized following formation of phase change material 220. In an embodiment, a chemical/mechanical polishing technique may be utilized, although claimed subject matter is not limited in this respect. In an embodiment, phase change material 220 may be placed in substantially direct contact with emitter 210.

FIG. 11 is an illustration depicting cross-sectional views of a portion of an example PCM memory array showing a stage of an example fabrication process, in accordance with an embodiment. As depicted in FIG. 11, an electrode material 230 may be formed over array 200, and may be patterned along a bit-line direction, in an embodiment. As with example embodiments described above in connection with FIGS. 3-8, conventional back-end-of-line (BEOL) techniques may be utilized to form word-line electrodes (not shown) and/or bit-line electrodes (not shown), although claimed subject matter is not limited in scope in this respect.

As depicted in FIGS. 9-11, and as discussed above, an example process for fabricating a heater-less PCM device may comprise self-aligning a phase change material region to an emitter region, whereby phase change material may be formed by conformal deposition into empty regions formed by a selective-etch of emitter material. See, for example, FIGS. 9 and 10, discussed above. By contrast, in example embodiments depicted in FIGS. 3-8, discussed above, a phase change material may be formed on a planar surface and etched to form individual PCM materials. See, for example, FIGS. 6 and 7, discussed above. A potential advantage of utilizing a self-aligned technique for forming PCM material may comprise an absence of an etching step of phase change material that may result in at least some damage to phase change material.

Example embodiments described herein may utilize relatively high-resistance interfaces between selector transistors and phase change material to generate sufficient heat to accomplish at least a partial melting of phase change material in programming a storage cell. Variations may occur during manufacturing at silicon/phase change material interfaces that result in variations in resistance characteristics at emitter/phase change material interfaces. However, because storage cell programming is dependent on resistance characteristics of emitter/phase change material interfaces, variability may be controlled at least in part utilizing a voltage-driven programming algorithm, in an embodiment. Although programming current depends on interface resistance characteristics, programming voltage on a PCM material may be expected to be substantially constant, independent of interface resistance. Embodiments for heater-less PCM devices may be implemented utilizing any type of silicon-based selector transistor, whether bipolar junction transistor (BJT), metal oxide semiconductor (MOS), or diode based, and/or any type of selector material with sufficiently high interface resistance for a particular phase change material.

An example technique for programming a phase change memory cell may comprise melting at least a portion of a phase change material by heating an interface between the phase change material and an emitter of a selector transistor. The emitter may be in substantially direct contact with the phase change memory cell, in an embodiment. Additionally, the interface between the phase change material and the emitter may be accomplished at least in part by forcing a current through the interface. Forcing the current through the interface may comprise energizing a word-line electrode coupled to a base component of the selector transistor through a base interconnect and a silicide region formed in the base component of the selector transistor, for example. Further, in an embodiment the selector transistor may comprise a CMOS selector transistor and the emitter region of the selector transistor may comprise one of a drain region and a source region of the CMOS selector transistor. An example technique for programming a phase change memory cell may further comprise forming an access line coupled to the other one of the drain region and the source region of the CMOS selector transistor through an interconnect and a silicide region formed on the other one of the drain region and the source region of the CMOS selector transistor, in an embodiment. Of course, claimed subject matter is not limited in these respects.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

The invention claimed is:

1. A method, comprising:
   forming a phase change material on an emitter region of a selector transistor, the phase change material to be in substantially direct contact with the emitter region of the selector transistor, wherein an interface between the phase change material and the emitter region does not include a silicide.

2. The method of claim 1, wherein the interface has a higher resistance than a similar interface having a silicide between the phase change material and the emitter.

3. The method of claim 1, wherein the forming the phase change material on the emitter region comprises depositing the phase change material on the emitter region.

4. The method of claim 3, wherein the depositing the phase change material on the emitter region comprises forming the phase change material over emitter material deposited in a trench formed in a dielectric material and over the dielectric material.

5. The method of claim 4, further comprising etching the phase change material to form a phase change memory material.

6. The method of claim 4, further comprising etching the emitter material to reduce the height of the emitter material in the trench formed in the dielectric material prior to the forming the phase change material over the emitter material.

7. The method of claim 6, wherein the forming the phase change material on the emitter comprises substantially conformally depositing the phase change material into the trench.

8. The method of claim 1, wherein the forming the phase change material on the emitter region of the selector transistor comprises protecting the emitter region from the formation of a silicide region between the phase change material and the emitter region.

9. A memory device, comprising:
one or more storage cells individually comprising a selector transistor in substantially direct contact with a phase change memory material, wherein an interface between the phase change material and the selector transistor does not include a silicide.

10. The memory device of claim 9, wherein the selector transistor comprises a bipolar junction transistor.

11. The memory device of claim 10, wherein the selector transistor comprises an emitter in substantially direct contact with the phase change memory material.

12. The memory device of claim 11, the selector transistor further comprising a base component electrically coupled between the emitter and a collector.

13. The memory device of claim 12, further comprising a base contact electrically coupled to the base component.

14. The memory device of claim 13, further comprising:
a silicide region formed on the base contact; and
a base interconnect electrically coupled between the silicide region and a word-line electrode.

15. A method, comprising:
energizing an electrode of a memory array to energize one or more selector transistors of the memory array and to energize one or more phase change memory materials in substantially direct contact with the one or more selector transistors to generate heat sufficient to at least partially melt at least a portion of the one or more phase change memory materials as part of a programming operation, wherein interfaces between the phase change materials and the selector transistors do not include a silicide.

16. The method of claim 15, wherein the energizing the electrode comprises energizing a bit-line electrode.

17. The method of claim 16, wherein the energizing the bit-line electrode to energize one or more selector transistors comprises applying a voltage signal to the bit-line electrode to apply the voltage signal to the one or more phase change memory materials electrically coupled between the bit-line electrode and one or more emitters of the one or more selector transistors.

18. The method of claim 16, wherein energizing the electrode to energize one or more selector transistors and to energize one or more phase change memory materials in substantially direct contact with the one or more selector transistors comprises applying the voltage signal to the bit-line electrode to apply the voltage signal to a relatively high-resistance interface between the one or more selector transistors and the one or more phase change memory materials.

19. A method of programming a phase change memory cell comprising:
melting at least a portion of a phase change material by heating an interface between the phase change material and an emitter of a selector transistor in substantially direct contact with the phase change memory cell, wherein the interface does not include a silicide.

20. The method of claim 19 wherein the heating the interface comprises forcing a current through the interface.

21. The method of claim 20 wherein forcing the current through the interface comprises energizing a word-line electrode coupled to a base component of the selector transistor through a base interconnect and a silicide region formed in the base component of the selector transistor.

22. The method of claim 19 wherein the selector transistor comprises a CMOS selector transistor and the emitter region of the selector transistor comprises one of a drain region and a source region of the CMOS selector transistor.

23. The method of claim 22 further comprising forming an access line coupled to the other one of the drain region and the source region of the CMOS selector transistor through an interconnect and a silicide region formed on the other one of the drain region and the source region of the CMOS selector transistor.

* * * * *